United States Patent
Guo et al.

(10) Patent No.: US 11,784,446 B2
(45) Date of Patent: Oct. 10, 2023

(54) CONNECTOR WITH IMPROVED SHELL

(71) Applicant: DONGGUAN LUXSHARE TECHNOLOGIES CO., LTD, Dongguan (CN)

(72) Inventors: Rongzhe Guo, Dongguan (CN); Bin Huang, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 44 days.

(21) Appl. No.: 17/585,013

(22) Filed: Jan. 26, 2022

(65) Prior Publication Data
US 2023/0043233 A1    Feb. 9, 2023

(30) Foreign Application Priority Data
Aug. 5, 2021    (CN) .......................... 202121827702.9

(51) Int. Cl.
*H01R 24/60*    (2011.01)
(52) U.S. Cl.
CPC .................................. *H01R 24/60* (2013.01)
(58) Field of Classification Search
None
See application file for complete search history.

(56) References Cited

U.S. PATENT DOCUMENTS

| | | | | |
|---|---|---|---|---|
| 7,997,909 | B2 * | 8/2011 | Xu | H01R 13/6658 439/607.57 |
| 8,454,381 | B2 * | 6/2013 | Wu | H01R 24/60 439/352 |
| 10,276,995 | B2 * | 4/2019 | Little | G02B 6/4284 |
| 11,025,013 | B2 * | 6/2021 | Little | H01R 13/6587 |

FOREIGN PATENT DOCUMENTS

CN    206610940 U    11/2017

* cited by examiner

*Primary Examiner* — Ross N Gushi
(74) *Attorney, Agent, or Firm* — Birch, Stewart, Kolasch & Birch, LLP

(57) ABSTRACT

A connector includes a first shell, a second shell, a tongue plate and a number of conductive pads. The first shell includes a first protruding piece extending along a first direction. The second shell includes a second protruding piece extending along the first direction. The tongue plate is located between the first protruding piece and the second protruding piece in a second direction. The tongue plate includes a mating surface. The plurality of conductive pads are provided on the tongue plate and exposed to the mating surface. The first protruding piece has a first width in a third direction perpendicular to the first direction and the second direction. The second protruding piece has a second width along the third direction. The first width is the same as the second width. As a result, the connector is easy to manufacture, thereby reducing the cost of the connector.

19 Claims, 11 Drawing Sheets

CONNECTOR WITH IMPROVED SHELL

CROSS-REFERENCE TO RELATED APPLICATION

This patent application claims priority of a Chinese Patent Application No. 202121827702.9, filed on Aug. 5, 2021 and titled "CONNECTOR", the entire content of which is incorporated herein by reference.

TECHNICAL FIELD

The present disclosure relates to a connector, which belongs to a technical field of electrical connectors.

BACKGROUND

An existing connector usually includes a tongue plate, a first protruding piece located on one side of the tongue plate, and a second protruding piece located on the other side of the tongue plate. A width of the first protruding piece and the second protruding piece are different, which increases the cost of the connector.

SUMMARY

An object of the present disclosure is to provide a connector with lower cost.

In order to achieve the above object, the present disclosure adopts the following technical solution: a connector, including: a first shell, the first shell including a first protruding piece extending along a first direction; a second shell, the second shell including a second protruding piece extending along the first direction; a tongue plate, the tongue plate being located between the first protruding piece and the second protruding piece in a second direction perpendicular to the first direction, the tongue plate including a mating surface; and a plurality of conductive pads, the plurality of conductive pads being arranged on the tongue plate and exposed to the mating surface; wherein the first protruding piece has a first width along a third direction perpendicular to the first direction and the second direction; the second protruding piece has a second width along the third direction; and the first width is the same as the second width.

In order to achieve the above object, the present disclosure adopts the following technical solution: a connector, including: a first shell, the first shell including a first protruding piece extending along a first direction; a second shell, the second shell including a second protruding piece extending along the first direction; an built-in circuit board, the built-in circuit board including a tongue plate located between the first protruding piece and the second protruding piece in a second direction perpendicular to the first direction, the tongue plate including a mating surface and a plurality of conductive pads, the plurality of conductive pads being exposed to the mating surface; an optical fiber, the optical fiber being electrically connected to the built-in circuit board; and a pull strap, the pull strap being adapted for pulling the connector from a mating connector when the connector requires to be separated from the mating connector; wherein the first shell and the second shell are detachably assembled together with the built-in circuit board being sandwiched between the first shell and the second shell; wherein the first protruding piece has a first width along a third direction perpendicular to the first direction and the second direction; the second protruding piece has a second width along the third direction; and the first width is the same as the second width.

Compared with the prior art, in the present disclosure, the first width of the first protruding piece is the same as the second width of the second protruding piece, thereby facilitating manufacturing and reducing the cost of the connector.

DETAILED DESCRIPTION

Figure 1:
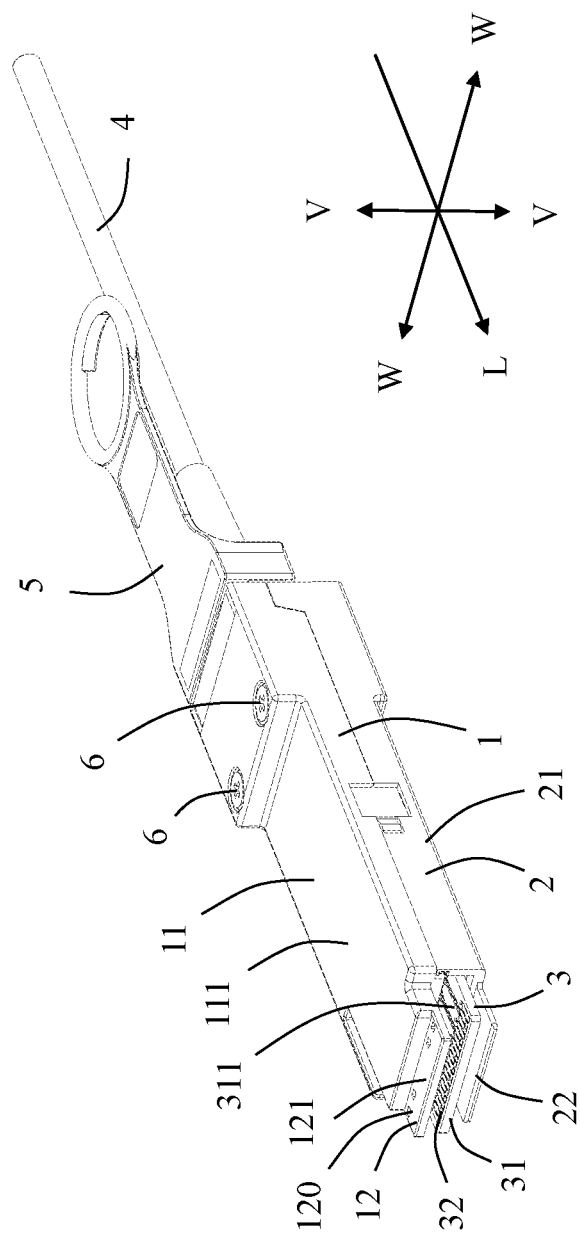
FIG. 1 is a perspective schematic view of a connector in accordance with an illustrated embodiment of the present disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Referring to FIGS. 1 to 9, the present disclosure discloses a connector including a first shell 1, a second shell 2, a built-in circuit board 3 located between the first shell 1 and the second shell 2, an optical fiber 4 electrically connected to the built-in circuit board 3, and a pull strap 5 located on one side of the optical fiber 4. In the illustrated embodiment of the present disclosure, the connector is a small form-factor pluggable (SPF) connector, a four-channel small form-factor pluggable (QSFP or QSFP+) connector, a four-channel small form-factor pluggable double density (QSFP-DD) connector or an eight-channel small form-factor pluggable (OSFP) connector, etc.

Figure 2:
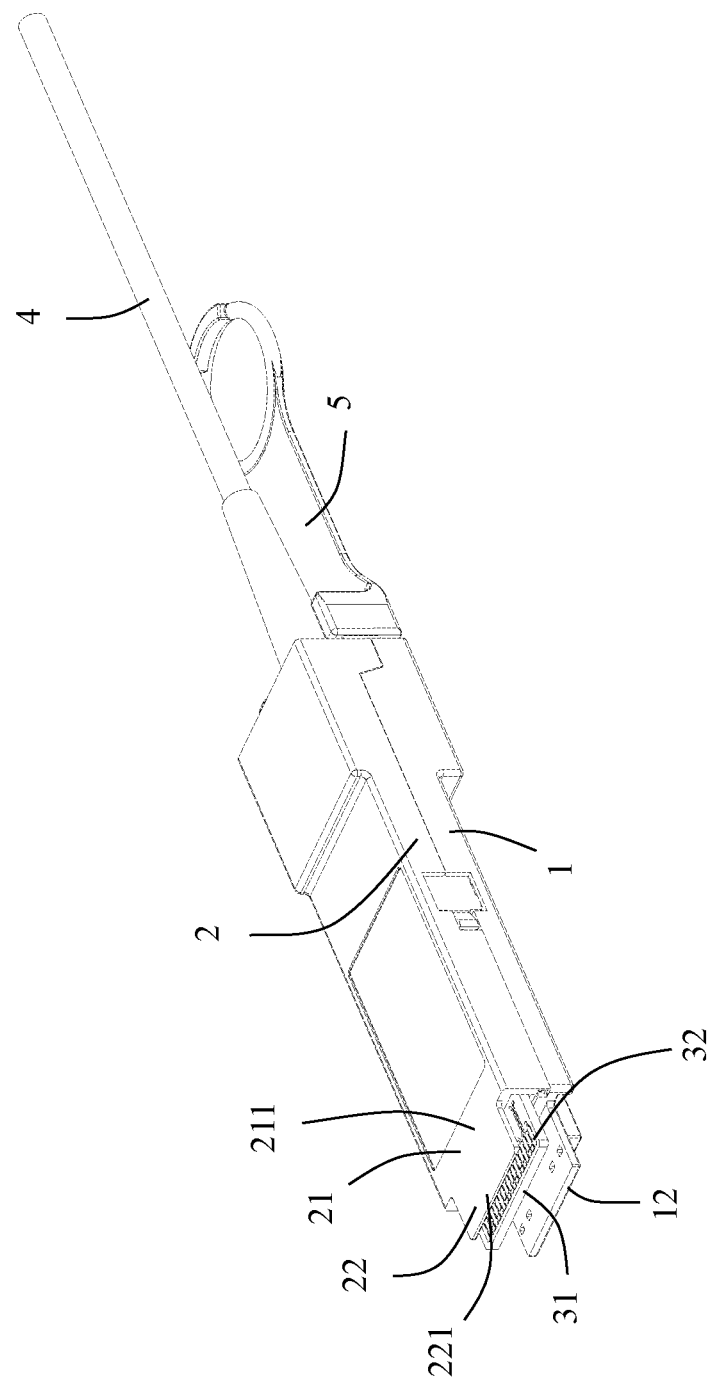
FIG. 2 is a perspective schematic view of FIG. 1 from another angle.
Figure 3:
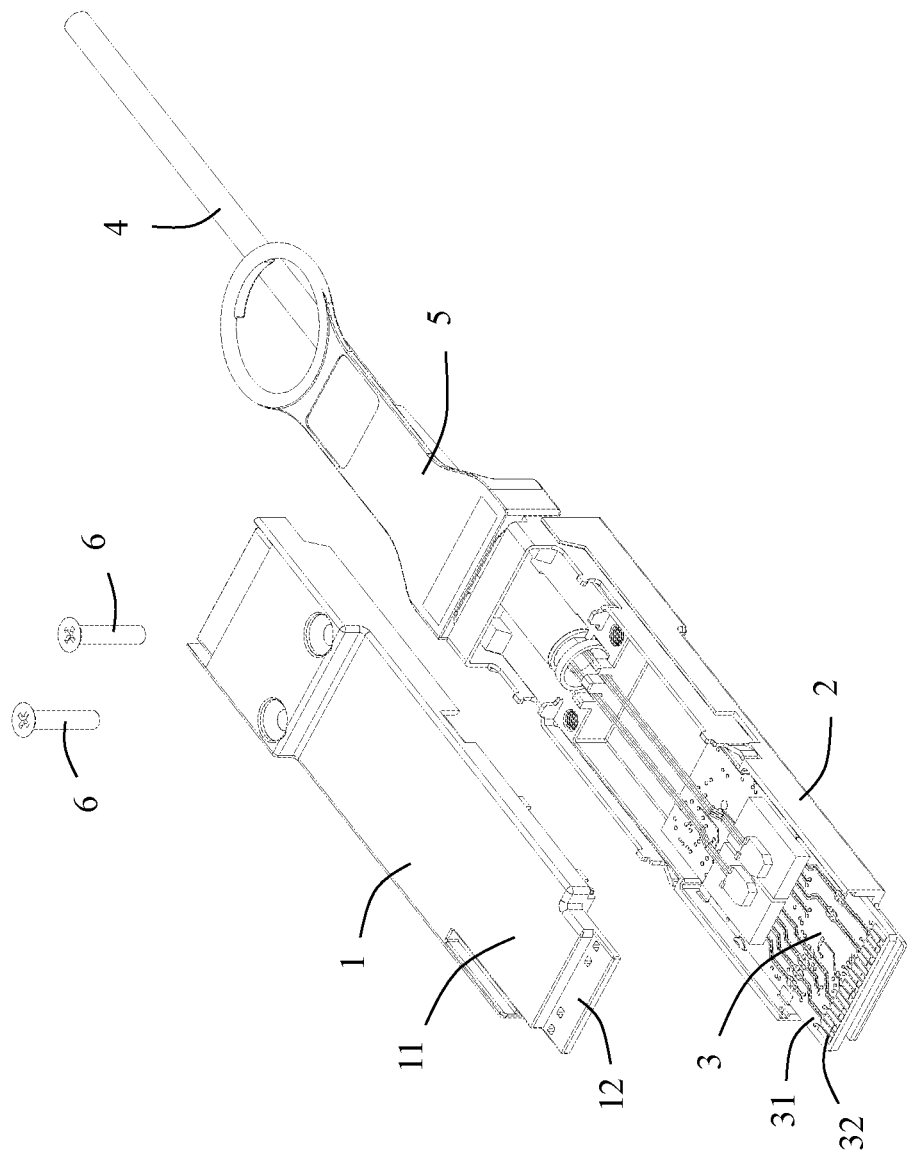
FIG. 3 is a partially exploded perspective view of FIG. 1.
Figure 4:
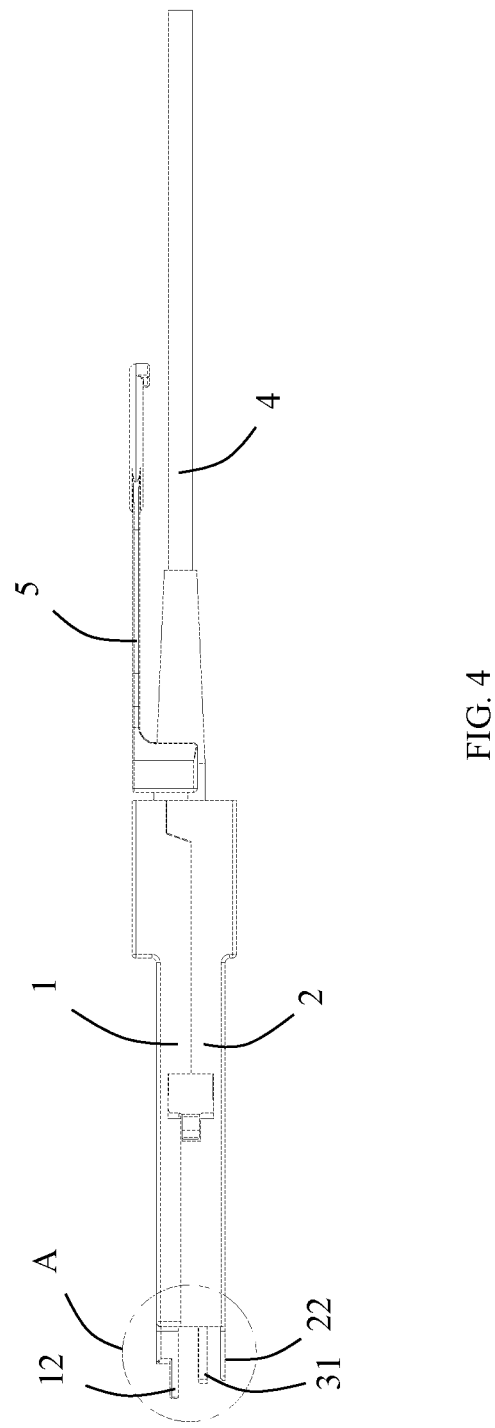
FIG. 4 is a right side view of FIG. 1.
Figure 5:
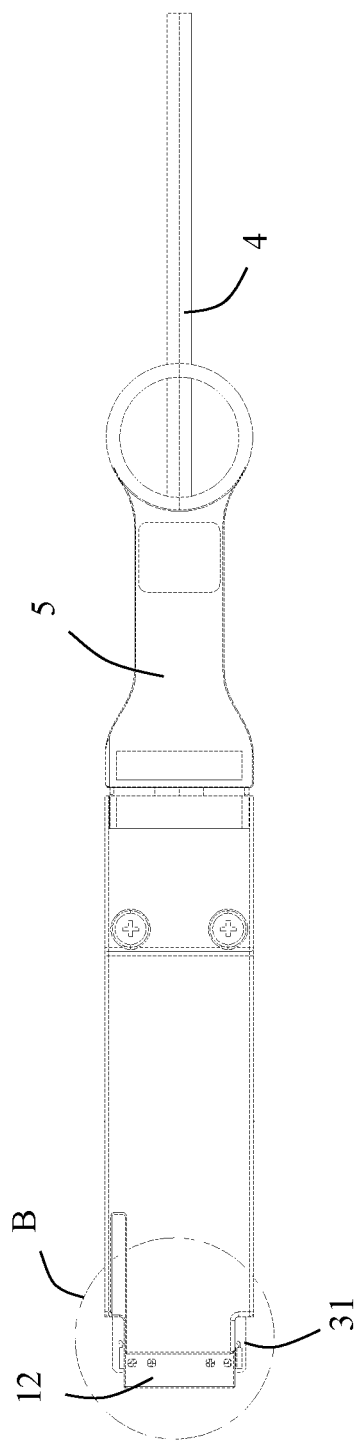
FIG. 5 is a top view of FIG. 1.
Figure 6:
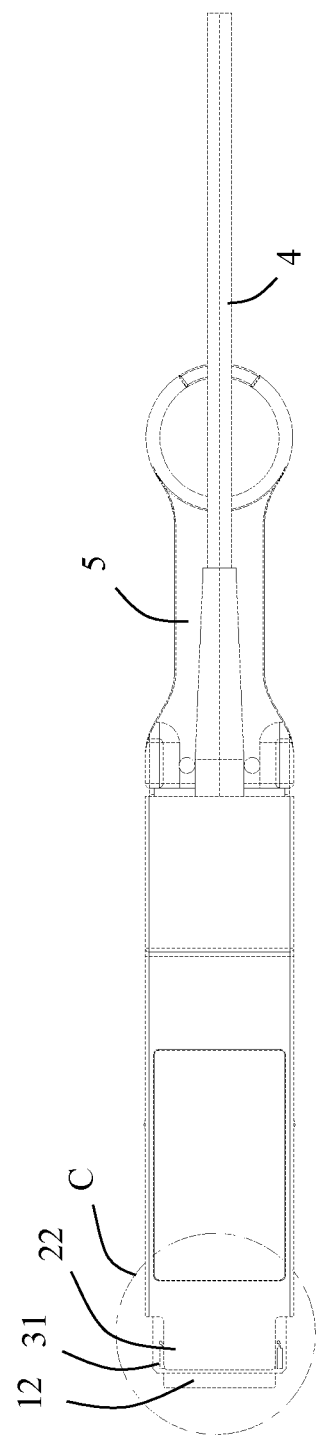
FIG. 6 is a bottom view of FIG. 1.

Referring to FIGS. 1 to 3, the first shell 1 and the second shell 2 are detachably assembled together. In an illustrated embodiment of the present disclosure, the first shell 1 and the second shell 2 are detachably assembled together by screws 6. The first shell 1 includes a first base 11 and a first protruding piece 12 integrally extending from the first base and along a first direction L. The first base 11 and the first protruding piece 12 jointly form a step shape. The first base 11 is provided with a first outer surface 111. The first protruding piece 12 is provided with a second outer surface 121. The second outer surface 121 is lower than the first outer surface 111.

Figure 7:
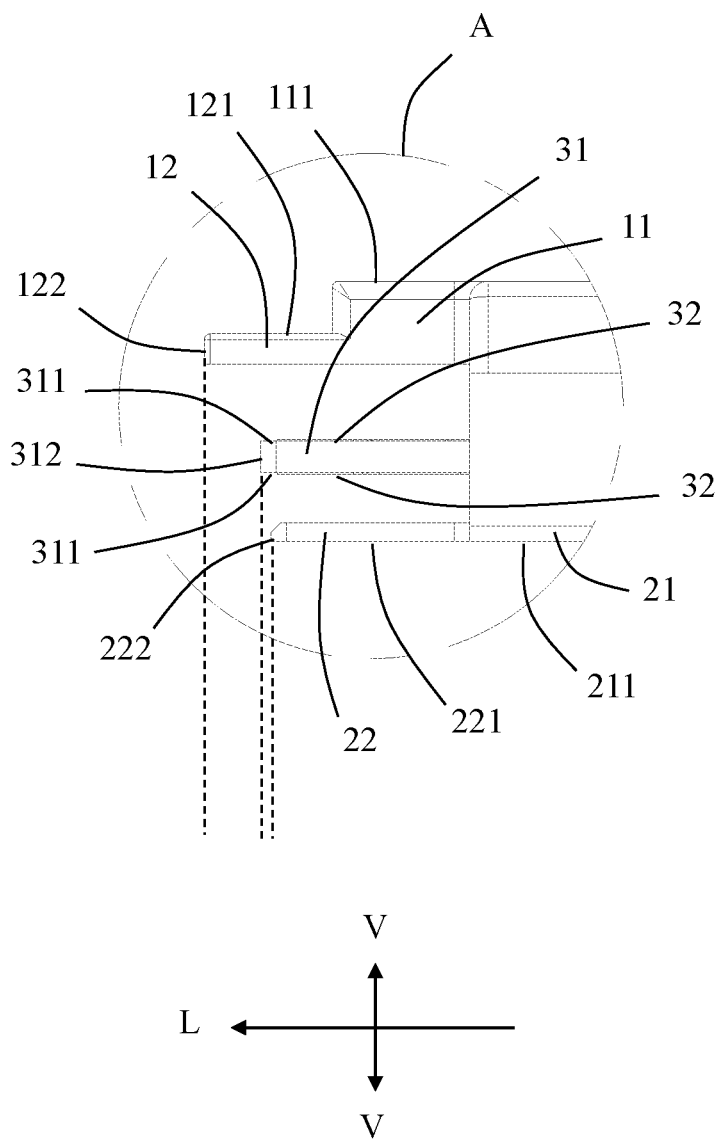
FIG. 7 is a partial enlarged view of a circled part A in FIG. 4.

Referring to FIGS. 2 and 7, the second shell 2 includes a second base 21 and a second protruding piece 22 integrally extending from the second base 21 and along the first direction L. The second base 21 is provided with a third outer surface 211. The second protruding piece 22 is provided with a fourth outer surface 221. The third outer surface 211 and the fourth outer surface 221 are coplanar.

The built-in circuit board 3 includes a tongue plate 31 and a plurality of conductive pads 32 provided on the tongue plate 31. The tongue plate 31 is adapted to be inserted into a mating connector (not shown). The tongue plate 31 is located between the first protruding piece 12 and the second protruding piece 22 in a second direction V-V perpendicular to the first direction L. The tongue plate 31 includes a mating surface 311. In the illustrated embodiment of the present disclosure, there are two mating surfaces 311 and they are located on the upper and lower sides of the tongue plate 31, respectively. The second outer surface 121 is closer to the tongue plate 31 than the first outer surface 111 in the second direction V-V. In other words, a distance between the second outer surface 121 and the tongue plate 31 in the second direction V-V is smaller than a distance between the first outer surface 111 and the tongue plate 31 in the second direction V-V. The pull strap 5 is adapted for pulling the connector from the mating connector when the connector requires to be separated from the mating connector.

The plurality of conductive pads 32 are disposed on the tongue plate 31 and exposed to the mating surface 311. The plurality of conductive pads 32 include multiple pairs of differential signal conductive pads DP (Differential Pair) for transmitting high-speed signals.

Figure 8:
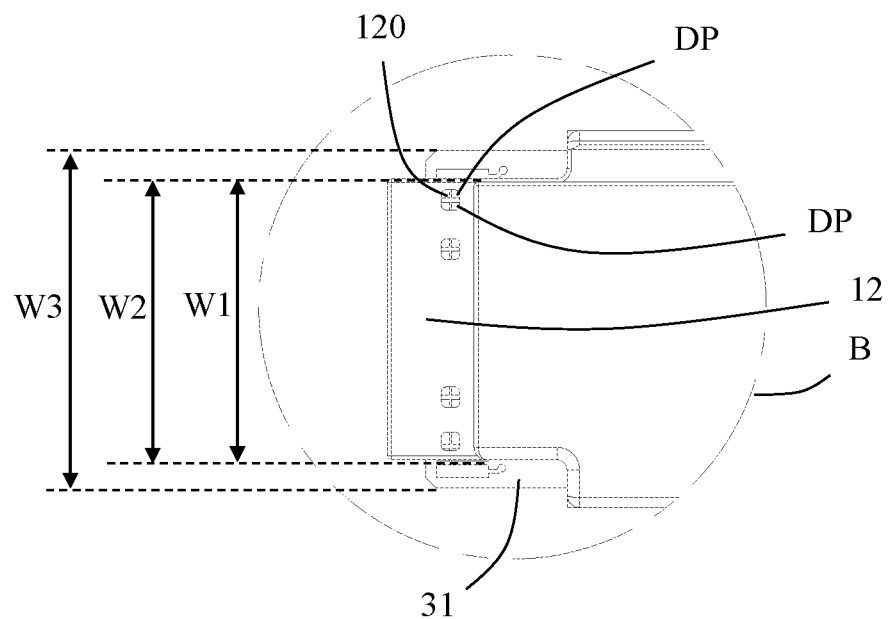
FIG. 8 is a partial enlarged view of a circled part B in FIG. 5.
Figure 8:
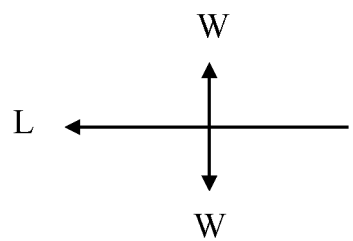
Figure 9:
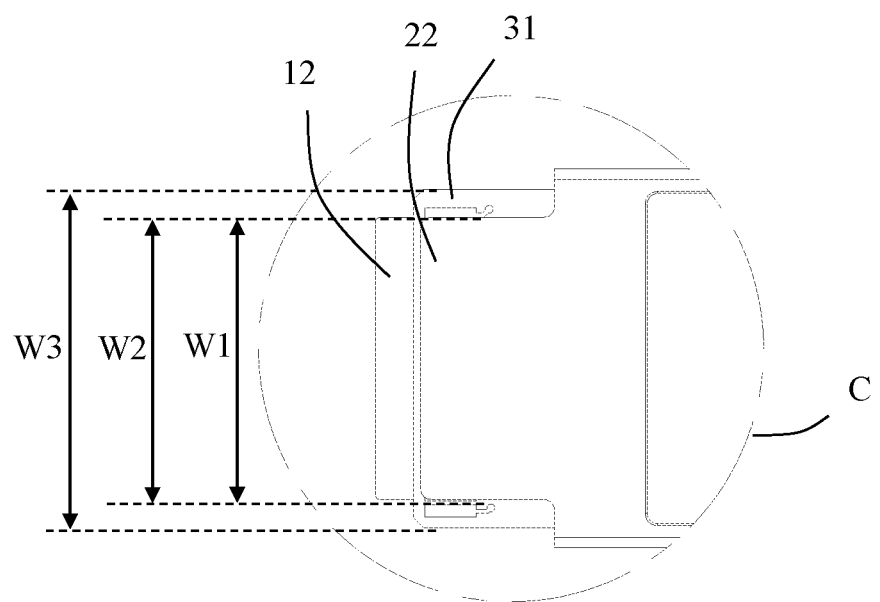
FIG. 9 is a partial enlarged view of a circled part C in FIG. 6.
Figure 9:
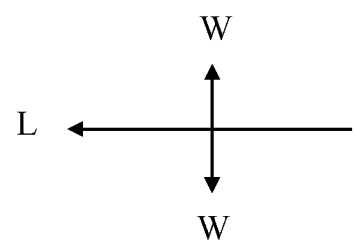

Referring to FIGS. 8 and 9, in the illustrated embodiment of the present disclosure, the first protruding piece 12 has a first width W1 along a third direction W-W perpendicular to the first direction L and the second direction V-V. The second protruding piece 22 has a second width W2 along the third direction W-W. The tongue plate 31 has a third width W3 along the third direction W-W. The first width W1 is the same as the second width W2. Furthermore, neither the first width W1 nor the second width W2 is greater than the third width W3. In the illustrated embodiment of the present disclosure, any of the first width W1 and the second width W2 is smaller than the third width W3.

Referring to FIG. 7, in an embodiment of the present disclosure, the first protruding piece 12 is provided with a first end surface 122, the second protrusion 22 is provided with a second end surface 222, and the tongue plate 31 is provided with a third end surface 312. The first end surface 122 extends beyond the third end surface 312 along the first direction L. The third end surface 312 extends beyond the second end surface 222 along the first direction L. In other words, the first protruding piece 12 is longer than the tongue plate 31 in the first direction L. The second protruding piece 22 is shorter than the tongue plate 31 in the first direction L.

Figure 10:
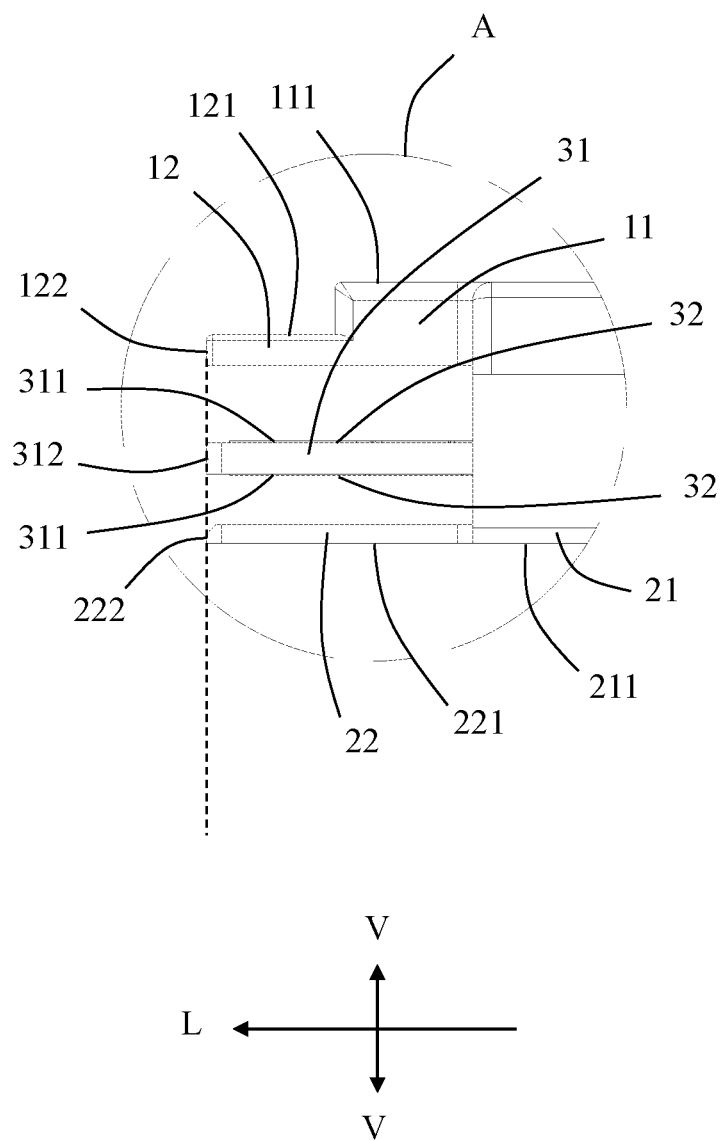
FIG. 10 is a partial enlarged view in another embodiment of FIG. 7.

Referring to FIG. 10, in another embodiment of the present disclosure, an end position where the first end surface 122 extends along the first direction L is flush with an end position where the second end surface 222 extends along the first direction L. In other words, the projections of the first end surface 122 and the second end surface 222 in the second direction V-V are aligned with each other. Referring to FIG. 10, in this embodiment, the projections of the first end surface 122, the second end surface 222, and the third end surface 312 in the second direction V-V are all aligned with each other.

Referring to FIG. 8, the first protruding piece 12 defines at least one first through hole 120 extending through the first protruding piece 12 along the second direction V-V. The pair of differential signal conductive pads DP are exposed in the first through hole 120 along the second direction V-V, so as to facilitate the observation of the position of the pair of differential signal conductive pads DP. In the illustrated embodiment of the present disclosure, the first protruding piece 12 defines a plurality of first through holes 120 extending through the first protruding piece 12 along the second direction V-V. The plurality of first through holes 120 are arranged at intervals along the third direction W-W. Each pair of differential signal conductive pads DP are exposed to a corresponding first through hole 120 along the second direction V-V, so as to facilitate observation of the position of the pair of differential signal conductive pads DP.

Figure 11:
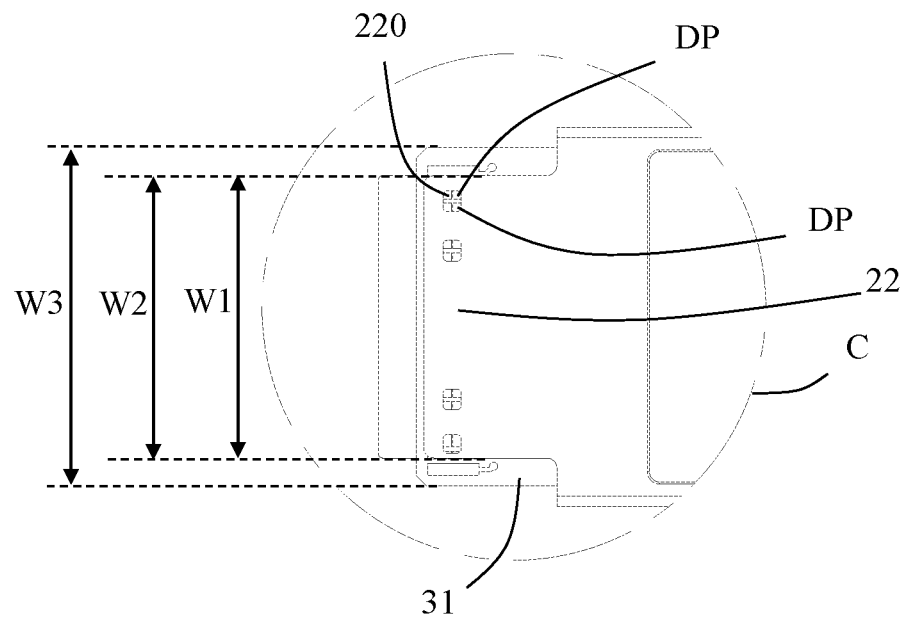
FIG. 11 is a partial enlarged view in another embodiment of FIG. 9.
Figure 11:
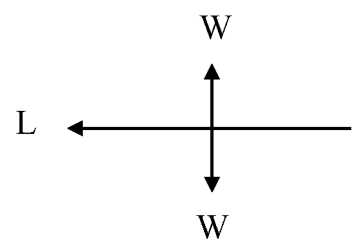

Referring to FIG. 11, in another embodiment of the present disclosure, the second protruding piece 22 defines at least one second through hole 220 extending through the second protruding piece 22 along the second direction V-V. The pair of differential signal conductive pads DP are exposed in the second through hole 220 along the second direction V-V, so as to facilitate the observation of the position of the pair of differential signal conductive pads DP. In the illustrated embodiment of the present disclosure, the second protruding piece 22 defines a plurality of second through holes 220 extending through the second protruding piece 22 along the second direction V-V. The plurality of second through holes 220 are arranged at intervals along the third direction W-W. Each pair of differential signal conductive pads DP are exposed to a corresponding second through hole 220 along the second direction V-V, so as to facilitate observation of the position of the pair of differential signal conductive pads DP.

In the illustrated embodiment of the present disclosure, the first direction L is a rear-to-front direction. The second direction V-V is a top-bottom direction. The third direction W-W is a left-right direction.

Compared with the prior art, the present disclosure discloses that the first width W1 of the first protruding piece 12 is the same as the second width W2 of the second protruding piece 22, thereby facilitating manufacturing and reducing the cost of the connector.

The above embodiments are only used to illustrate the present disclosure and not to limit the technical solutions described in the present disclosure. The understanding of this specification should be based on those skilled in the art. Descriptions of directions, such as "front", "back", "left", "right", "top" and "bottom", although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A connector, comprising:
   a first shell, the first shell comprising a first protruding piece extending along a first direction;
   a second shell, the second shell comprising a second protruding piece extending along the first direction;
   a tongue plate, the tongue plate being located between the first protruding piece and the second protruding piece in a second direction perpendicular to the first direction, the tongue plate comprising a mating surface; and
   a plurality of conductive pads, the plurality of conductive pads being arranged on the tongue plate and exposed to the mating surface;
   wherein the first protruding piece has a first width along a third direction perpendicular to the first direction and the second direction; the second protruding piece has a second width along the third direction; and the first width is the same as the second width; and
   wherein the plurality of conductive pads comprise at least one pair of differential signal conductive pads, the first protruding piece defines at least one through hole extending through the first protruding piece along the second direction, and the at least one pair of differential signal conductive pads are exposed in the at least one through hole along the second direction.

2. The connector according to claim 1, wherein the tongue plate has a third width along the third direction, and any of first width and the second width is smaller than the third width.

3. The connector according to claim 1, wherein the first protruding piece is provided with a first end surface, the second protruding piece is provided with a second end surface, and the first end surface extends beyond the second end surface along the first direction.

4. The connector according to claim 3, wherein the tongue plate is provided with a third end surface, the first end surface extends beyond the third end surface in the first direction, and the third end surface extends beyond the second end surface along the first direction.

5. The connector according to claim 1, wherein the first protruding piece is provided with a first end surface, the second protruding piece is provided with a second end surface, the first end surface extends along the first direction, the second end surface extends along the first direction, and the first end surface is aligned with the second end surface.

6. The connector according to claim 5, wherein the tongue plate is provided with a third end surface, the third end surface extends along the first direction, and the first end surface, the second end surface and the third end surface are aligned with each other.

7. The connector according to claim 1, wherein the plurality of conductive pads comprise multiple pairs of differential signal conductive pads, the first protruding piece defines a plurality of first through holes extending through the first protruding piece along the second direction, the plurality of first through holes are arranged at intervals along the third direction, and each pair of differential signal conductive pads are exposed in a corresponding first through hole along the second direction.

8. The connector according to claim 1, wherein the plurality of conductive pads comprise multiple pairs of differential signal conductive pads, the second protruding piece defines a plurality of second through holes extending through the second protruding piece along the second direction, the plurality of second through holes are arranged at intervals along the third direction, and each pair of differential signal conductive pads are exposed to a corresponding second through hole along the second direction.

9. The connector according to claim 1, wherein the first shell comprises a first base, the first protruding piece is formed by integrally extending from the first base and along the first direction, the first base and the first protruding piece jointly form a step shape; wherein the first base is provided with a first outer surface, the first protruding piece is provided with a second outer surface, and the second outer surface is closer to the tongue plate in the second direction than the first outer surface.

10. The connector according to claim 9, wherein the second shell comprises a second base, the second protruding piece is formed by integrally extending from the second base and along the first direction; wherein the second base is provided with a third outer surface, the second protruding piece is provided with a fourth outer surface, and the third outer surface is coplanar with the fourth outer surface.

11. A connector, comprising:
    a first shell, the first shell comprising a first protruding piece extending along a first direction;
    a second shell, the second shell comprising a second protruding piece extending along the first direction;
    a tongue plate, the tongue plate being located between the first protruding piece and the second protruding piece in a second direction perpendicular to the first direction, the tongue plate comprising a mating surface; and
    a plurality of conductive pads, the plurality of conductive pads being arranged on the tongue plate and exposed to the mating surface;
    wherein the first protruding piece has a first width along a third direction perpendicular to the first direction and the second direction; the second protruding piece has a second width along the third direction; and the first width is the same as the second width;
    wherein the connector further comprises a built-in circuit board, the tongue plate and the plurality of conductive pads are provided on the built-in circuit board; wherein the connector further comprises an optical fiber electrically connected to the built-in circuit board and a pull strap located on one side of the optical fiber along the second direction.

12. A connector, comprising:
    a first shell, the first shell comprising a first protruding piece extending along a first direction;
    a second shell, the second shell comprising a second protruding piece extending along the first direction;
    a built-in circuit board, the built-in circuit board comprising a tongue plate located between the first protruding piece and the second protruding piece in a second direction perpendicular to the first direction, the tongue plate comprising a mating surface and a plurality of conductive pads, the plurality of conductive pads being exposed to the mating surface;

an optical fiber, the optical fiber being electrically connected to the built-in circuit board; and a pull strap, the pull strap being adapted for pulling the connector from a mating connector when the connector requires to be separated from the mating connector;

wherein the first shell and the second shell are detachably assembled together with the built-in circuit board being sandwiched between the first shell and the second shell; and wherein the first protruding piece has a first width along a third direction perpendicular to the first direction and the second direction; the second protruding piece has a second width along the third direction; and the first width is the same as the second width.

13. The connector according to claim 12, wherein the tongue plate has a third width along the third direction, and any of first width and the second width is smaller than the third width.

14. The connector according to claim 12, wherein the first protruding piece is provided with a first end surface, the second protruding piece is provided with a second end surface, and the first end surface extends beyond the second end surface along the first direction; and wherein the tongue plate is provided with a third end surface, the first end surface extends beyond the third end surface in the first direction, and the third end surface extends beyond the second end surface along the first direction.

15. The connector according to claim 12, wherein the first protruding piece is provided with a first end surface, the second protruding piece is provided with a second end surface, the first end surface extends along the first direction, the second end surface extends along the first direction, and the first end surface is aligned with the second end surface; and wherein the tongue plate is provided with a third end surface, the third end surface extends along the first direction, and the first end surface, the second end surface and the third end surface are aligned with each other.

16. The connector according to claim 12, wherein the plurality of conductive pads comprise at least one pair of differential signal conductive pads, the first protruding piece defines at least one through hole extending through the first protruding piece along the second direction, and the at least one pair of differential signal conductive pads are exposed in the at least one through hole along the second direction.

17. The connector according to claim 16, wherein the plurality of conductive pads comprise multiple pairs of differential signal conductive pads, the first protruding piece defines a plurality of first through holes extending through the first protruding piece along the second direction, the plurality of first through holes are arranged at intervals along the third direction, and each pair of differential signal conductive pads are exposed in a corresponding first through hole along the second direction.

18. The connector according to claim 16, wherein the plurality of conductive pads comprise multiple pairs of differential signal conductive pads, the second protruding piece defines a plurality of second through holes extending through the second protruding piece along the second direction, the plurality of second through holes are arranged at intervals along the third direction, and each pair of differential signal conductive pads are exposed to a corresponding second through hole along the second direction.

19. The connector according to claim 12, wherein the first shell comprises a first base, the first protruding piece is formed by integrally extending from the first base and along the first direction, the first base and the first protruding piece jointly form a step shape; wherein the first base is provided with a first outer surface, the first protruding piece is provided with a second outer surface, and the second outer surface is closer to the tongue plate in the second direction than the first outer surface; and wherein the second shell comprises a second base, the second protruding piece is formed by integrally extending from the second base and along the first direction; wherein the second base is provided with a third outer surface, the second protruding piece is provided with a fourth outer surface, and the third outer surface is coplanar with the fourth outer surface.

\* \* \* \* \*